(12) United States Patent
Peng et al.

(10) Patent No.: US 12,407,359 B2
(45) Date of Patent: Sep. 2, 2025

(54) SUCCESSIVE APPROXIMATION ANALOG-TO-DIGITAL CONVERTER FOR A PAM-($2^N$-2) RECEIVER

(71) Applicant: National Tsing Hua University, Hsinchu (TW)

(72) Inventors: Pen-Jui Peng, Hsinchu (TW); Yun-Cheng Jao, Hsinchu (TW); Yen-Po Lin, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 163 days.

(21) Appl. No.: 18/519,646

(22) Filed: Nov. 27, 2023

(65) Prior Publication Data

US 2025/0175185 A1    May 29, 2025

(51) Int. Cl.
*H03M 1/10* (2006.01)
(52) U.S. Cl.
CPC ................ *H03M 1/1014* (2013.01)
(58) Field of Classification Search
CPC ...... H03M 1/1014; H03M 1/12; H03M 1/403; H03M 1/38
USPC .......... 341/155, 144, 172, 118, 120
See application file for complete search history.

(56) References Cited

U.S. PATENT DOCUMENTS

| 8,907,826 | B2* | 12/2014 | Hong | ............ H03M 1/12 341/172 |
| 9,467,161 | B1* | 10/2016 | Kim | ............ H03M 1/145 |
| 11,711,089 | B2* | 7/2023 | Sharma | ............ H03M 1/0675 341/118 |

FOREIGN PATENT DOCUMENTS

TW       200937915 A      9/2009

* cited by examiner

*Primary Examiner* — Peguy Jean Pierre
(74) *Attorney, Agent, or Firm* — Birch, Stewart, Kolasch & Birch, LLP

(57) ABSTRACT

A successive approximation ADC includes a switch circuit, a conversion circuit, a comparison circuit and a controller. The conversion circuit outputs first and second comparison voltages that are respectively equal to first and second input voltages when the switch circuit operates in an ON state. The comparison circuit compares the first and second comparison voltages to generate first and second comparison signals. Generation of least significant bits of the first and second comparison signals is related to two first capacitors and two second capacitors of the conversion circuit. When the other bits of the first comparison signal have identical logic values, the controller provides two different voltages respectively to the first capacitors and respectively to the second capacitors; and when otherwise, the controller provides one of the voltages to both of the first capacitors, and provides the other one of the voltages to both of the second capacitors.

5 Claims, 3 Drawing Sheets

SUCCESSIVE APPROXIMATION ANALOG-TO-DIGITAL CONVERTER FOR A PAM-($2^N$-2) RECEIVER

FIELD

The disclosure relates to a successive approximation analog-to-digital converter, and more particularly to a successive approximation analog-to-digital converter for a pulse amplitude modulation (PAM)-($2^N$-2) receiver.

BACKGROUND

A conventional analog-to-digital converter to be used in a receiver for decoding data in a pulse amplitude modulation (PAM)-6 format requires seven comparators and seven reference voltages, and disadvantageously occupies a large area and has high power consumption.

SUMMARY

Therefore, an object of the disclosure is to provide a successive approximation analog-to-digital converter for a pulse amplitude modulation (PAM)-($2^N$-2) receiver. The successive approximation analog-to-digital converter can alleviate at least one of the drawbacks of the prior art.

According to the disclosure, the successive approximation analog-to-digital converter is adapted to convert an analog input signal that is in a pulse amplitude modulation (PAM)-($2^N$-2) format into a digital output signal that is N-bits wide, where N≥3. The successive approximation analog-to-digital converter includes a switch circuit, a conversion circuit, a comparison circuit, a register and a controller. The switch circuit is adapted to receive a first input voltage and a second input voltage that cooperatively represent the analog input signal, is operable in an ON state and an OFF state, and is configured to permit transmission of the first input voltage and the second input voltage therethrough when operating in the ON state, and to prevent the transmission of the first input voltage and the second input voltage therethrough when operating in the OFF state. The conversion circuit includes a first capacitor group and a second capacitor group. The first capacitor group includes a first common node, and a number (N) of first capacitors each having a first terminal and a second terminal. The first common node is connected to the first terminals of the first capacitors, and is further connected to the switch circuit to receive the first input voltage. The first capacitors cooperatively output, at the first common node, a first comparison voltage that is equal to the first input voltage when the switch circuit operates in the ON state, and that varies according to voltages at the second terminals of the first capacitors when the switch circuit operates in the OFF state. The second capacitor group includes a second common node, and a number (N) of second capacitors each having a first terminal and a second terminal. The second common node is connected to the first terminals of the second capacitors, and is further connected to the switch circuit to receive the second input voltage. The second capacitors cooperatively output, at the second common node, a second comparison voltage that is equal to the second input voltage when the switch circuit operates in the ON state, and that varies according to voltages at the second terminals of the second capacitors when the switch circuit operates in the OFF state. The comparison circuit is connected to the first common node and the second common node to receive the first comparison voltage and the second comparison voltage, and is configured to compare the first comparison voltage and the second comparison voltage so as to generate a comparison output including a first comparison signal that is N-bits wide and a second comparison signal that is N-bits wide, where generation of a least significant bit of the first comparison signal and a least significant bit of the second comparison signal is related to two of the first capacitors and two of the second capacitors. The register is connected to the comparison circuit to receive the comparison output, and is configured to generate the digital output signal based on the comparison output. The controller is connected to the comparison circuit to receive the comparison output, is further connected to the second terminals of the first capacitors and the second terminals of the second capacitors, and is configured to, with respect to each of the first capacitors and the second capacitors, selectively provide one of a reference voltage and a ground voltage to the second terminal of the capacitor based on the comparison output. When a number (N−1) of most significant bits of the first comparison signal have identical logic values, the controller provides the reference voltage and the ground voltage respectively to the two first capacitors that are related to the generation of the least significant bit of the first comparison signal and the least significant bit of the second comparison signal, and provides the reference voltage and the ground voltage respectively to the two second capacitors that are related to the generation of the least significant bit of the first comparison signal and the least significant bit of the second comparison signal; and when otherwise, the controller provides one of the reference voltage and the ground voltage to both of the two first capacitors that are related to the generation of the least significant bit of the first comparison signal and the least significant bit of the second comparison signal, and provides the other one of the reference voltage and the ground voltage to both of the two second capacitors that are related to the generation of the least significant bit of the first comparison signal and the least significant bit of the second comparison signal.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
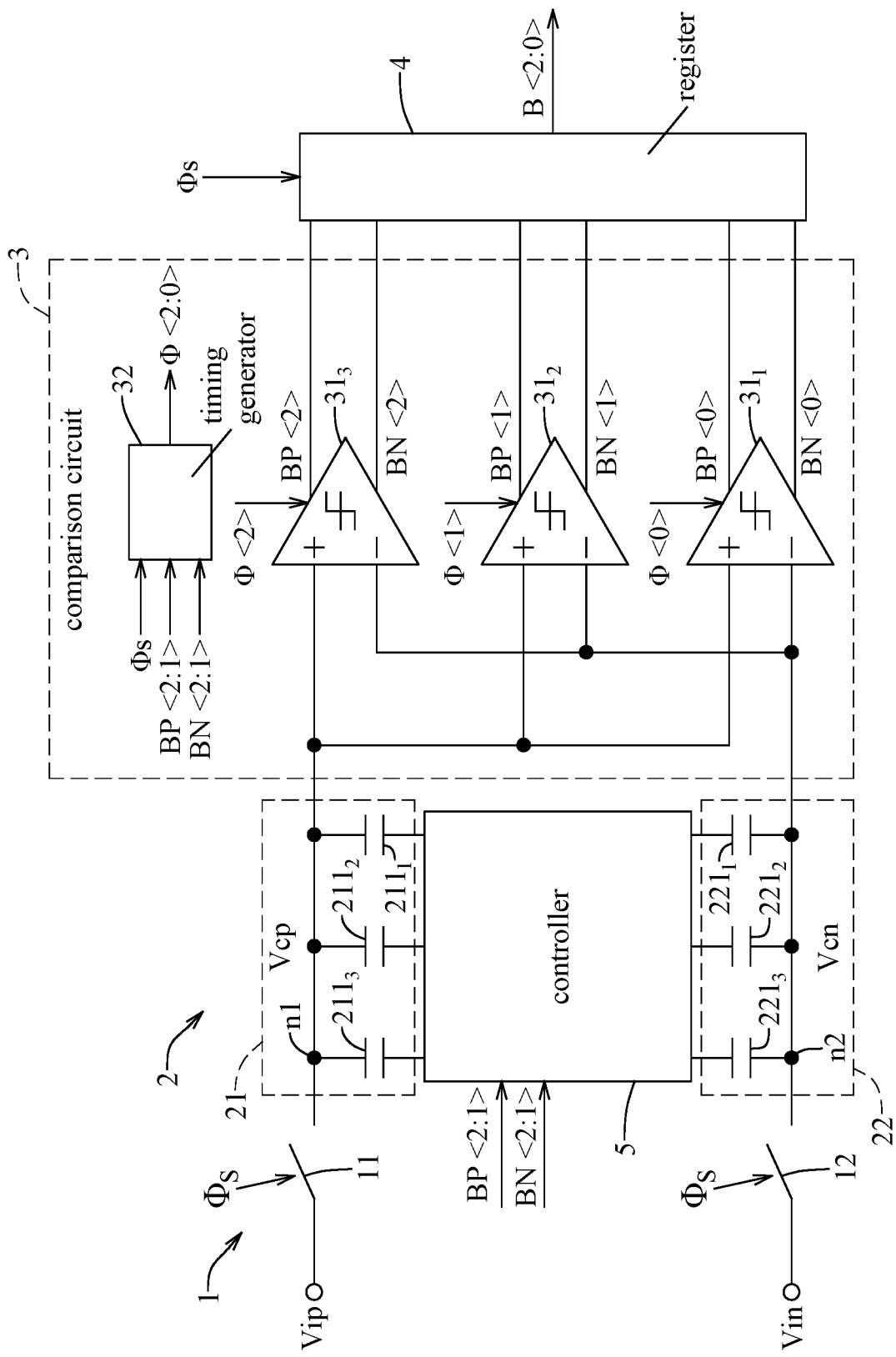
FIG. 1 is a circuit block diagram illustrating an embodiment of a successive approximation analog-to-digital converter according to the disclosure for a pulse amplitude modulation (PAM)-($2^N$-2) receiver.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
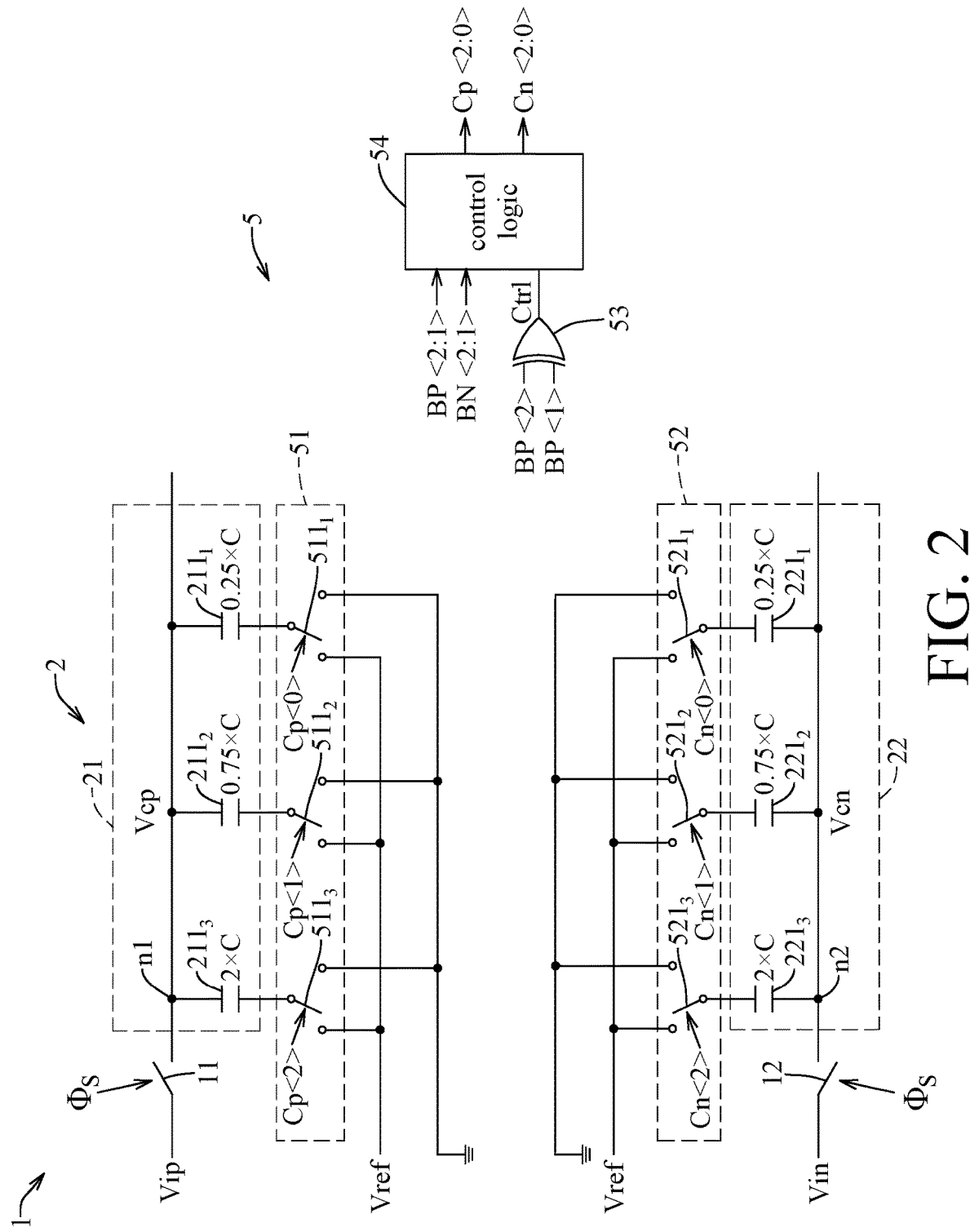
FIG. 2 is a circuit block diagram illustrating a controller of the embodiment.

Referring to FIGS. 1 and 2, an embodiment of a successive approximation analog-to-digital converter according to the disclosure is adapted to used in a pulse amplitude modulation (PAM)-($2^N$-2) receiver to convert an analog input signal that is in a PAM-($2^N$-2) format into a digital output signal that is N-bits wide, where N≥3. For illustration purposes, N=3 in this embodiment (i.e., the receiver is a PAM-6 receiver, the analog input signal is in a PAM-6 format, and the digital output signal (B<2:0>) is 3-bits wide). The successive approximation analog-to-digital converter of this embodiment includes a switch circuit 1, a conversion circuit 2, a comparison circuit 3, a register 4 and a controller 5. It should be noted that the successive approximation analog-to-digital converter of this embodiment is described in detail below under a premise that the gain loss of the conversion circuit 2 is ignored.

The switch circuit 1 is adapted to receive a first input voltage (Vip) and a second input voltage (Vin) that cooperatively represent the analog input signal, is adapted to further receive a clock signal (Φs), and is operable in an ON state and an OFF state based on the clock signal (Φs). The switch circuit 1 is configured to permit transmission of the first input voltage (Vip) and the second input voltage (Vin) therethrough when operating in the ON state, and to prevent the transmission of the first input voltage (Vip) and the second input voltage (Vin) therethrough when operating in the OFF state.

In this embodiment, the analog input signal has a voltage equal to a difference between the first input voltage (Vip) and the second input voltage (Vin) (e.g., Vip−Vin, and referred to as the input voltage difference hereinafter). In addition, 0≤Vip≤Vref, and 0≤Vin≤Vref, so −Vref≤Vip−Vin≤Vref, where Vref denotes a reference voltage. Moreover, the switch circuit 1 includes a first sampling switch 11 and a second sampling switch 12. The first sampling switch 11 has a first terminal that is adapted to receive the first input voltage (Vip), and a second terminal. The second sampling switch 12 has a first terminal that is adapted to receive the second input voltage (Vin), and a second terminal. Each of the first sampling switch 11 and the second sampling switch 12 further receives the clock signal (Φs), and transitions between conduction and non-conduction based on the clock signal (Φs). When the clock signal (Φs) is at a logic value "1", both of the first sampling switch 11 and the second sampling switch 12 conduct, and the switch circuit 1 operates in the ON state. When the clock signal (Φs) is at a logic value "0", none of the first sampling switch 11 and the second sampling switch 12 conducts, and the switch circuit 1 operates in the OFF state.

The conversion circuit 2 includes a first capacitor group 21 and a second capacitor group 22.

The first capacitor group 21 includes a first common node (n1), and a number (N) of first capacitors (i.e., three first capacitors $211_1$-$211_3$ in this embodiment) each having a first terminal and a second terminal. The first common node (n1) is connected to the first terminals of the first capacitors $211_1$-$211_3$, and is further connected to the second terminal of the first sampling switch 11 to receive the first input voltage (Vip). The first capacitors $211_1$-$211_3$ cooperatively output a first comparison voltage (Vcp) at the first common node (n1). When the switch circuit 1 operates in the ON state, the first input voltage (Vip) is transmitted through the conducting first sampling switch 11 to charge/discharge the first capacitors $211_1$-$211_3$, so the first comparison voltage (Vcp) will be equal to the first input voltage (Vip). When the switch circuit 1 operates in the OFF state, the first input voltage (Vip) is not transmitted through the non-conducting first sampling switch 11, and the first comparison voltage (Vcp) varies according to voltages at the second terminals of the first capacitors $211_1$-$211_3$. In this embodiment, the first capacitor $211_1$ has a capacitance of 0.25×C, the first capacitor $211_2$ has a capacitance of 0.75×C, and the first capacitor $211_n$ has a capacitance of $2^{n-2}$×C, where C denotes a predetermined capacitance value, and 3≤n≤N (i.e., n=3 in this embodiment). Therefore, a ratio of the capacitances of the first capacitors $211_1$-$211_3$ is 1:3:8.

Similarly, the second capacitor group (22) includes a second common node (n2), and a number (N) of second capacitors (i.e., three second capacitors $221_1$-$221_3$ in this embodiment) each having a first terminal and a second terminal. The second common node (n2) is connected to the first terminals of the second capacitors ($221_1$-$221_3$), and is further connected to the second terminal of the second sampling switch 12 to receive the second input voltage (Vin). The second capacitors ($221_1$-$221_3$) cooperatively output a second comparison voltage (Vcn) at the second common node (n2). When the switch circuit 1 operates in the ON state, the second input voltage (Vin) is transmitted through the conducting second sampling switch 12 to charge/discharge the second capacitors $221_1$-$221_3$, so the second comparison voltage (Von) will be equal to the second input voltage (Vin). When the switch circuit 1 operates in the OFF state, the second input voltage (Vin) is not transmitted through the non-conducting second sampling switch 12, and the second comparison voltage (Vcn) varies according to voltages at the second terminals of the second capacitors $221_1$-$221_3$. In this embodiment, the second capacitor $221_1$ has a capacitance of 0.25×C, the second capacitor $221_2$ has a capacitance of 0.75×C, and the second capacitor $221_n$ has a capacitance of $2^{n-2}$×C, where C denotes the predetermined capacitance value, and 3≤n≤N (i.e., n=3 in this embodiment). Therefore, a ratio of the capacitances of the second capacitors $221_1$-$221_3$ is 1:3:8.

The comparison circuit 3 is connected to the first common node (n1) and the second common node (n2) to receive the first comparison voltage (Vcp) and the second comparison voltage (Vcn), and is configured to compare the first comparison voltage (Vcp) and the second comparison voltage (Vcn) so as to generate a comparison output including a first comparison signal that is N-bits wide (i.e., the first comparison signal (BP<2:0>) is 3-bits wide in this embodiment) and a second comparison signal that is N-bits wide (i.e., the second comparison signal (BN<2:0>) is 3-bits wide in this embodiment). Generation of a least significant bit of the first comparison signal (BP<0>) and a least significant bit of the second comparison signal (BN<0>) is related to the two first capacitors $211_1$, $211_2$ and the two second capacitors $221_1$, $221_2$, and generation of a bit of the first comparison signal (BP<n>) and a bit of the second comparison signal (BN<n>) is related to the first capacitor $211_{n+2}$ and the second capacitor $221_{n+2}$, where 1≤n≤N−2 (i.e., n=1 in this embodiment).

In this embodiment, the comparison circuit 3 includes a number (N) of comparators (i.e., three comparators $31_1$-$31_3$ in this embodiment) and a timing generator 32. The comparators ($31_n$) is connected to the first common node (n1) and the second common node (n2) to receive the first comparison voltage (Vcp) and the second comparison voltage (Vcn), and is operable in an enabled mode where comparison between the first comparison voltage (Vcp) and the second comparison voltage (Vcn) is performed so as to generate the bit of the first comparison signal (BP<n−1>) and the bit of the second comparison signal (BN<n−1>), and a disabled mode where the comparison between the first comparison voltage (Vcp) and the second comparison voltage (Vcn) is not performed, in which 1≤n≤N (i.e., 1≤n≤3 in this embodiment). The timing generator 32 is connected to the comparators $31_1$-$31_3$, receives a number (N−1) of most significant bits of the first comparison signal (i.e., the two most significant bits of the first comparison signal (BP<2:1>) in this embodiment) and a number (N−1) of most significant bits of the second comparison signal (i.e., the two most significant bits of the second comparison signal (BN<2:1>) in this embodiment) from the comparators $31_2$, $31_3$, and further receives the clock signal ($\Phi$s). The timing generator 32 is configured to control transition of the comparators $31_1$-$31_3$ between the enabled mode and the disabled mode based on the two most significant bits of the first comparison signal (BP<2:1>), the two most significant bits of the second comparison signal (BN<2:1>) and the clock signal ($\Phi$s).

In this embodiment, the timing generator 32 generates a timing signal that is N-bits wide (i.e., a timing signal ($\Phi$<2:0>) that is 3-bits wide in this embodiment) to control transition of the comparators $31_1$-$31_3$ between the enabled mode and the disabled mode. The comparator ($31_n$) operates in the enabled mode when a bit of the timing signal ($\Phi$<n−1>) is at a logic value "1", and operates in the disabled mode when the bit of the timing signal ($\Phi$<n−1>) is at a logic value "0", where 1≤n≤N (i.e., 1≤n≤3 in this embodiment). Initially, the timing signal ($\Phi$<2:0>) is at the logic value "000", all of the comparators $31_1$-$31_3$ operate in the disabled mode, the first comparison signal (BP<2:0>) is at a logic value "000", and the second comparison signal (BN<2:0>) is at a logic value "000". Then, upon a falling edge of the clock signal ($\Phi$s), the bit of the timing signal ($\Phi$<2>) comes to be at the logic value "1", and the comparator $31_3$ enters the enabled mode and starts the comparison between the first comparison voltage (Vcp) and the second comparison voltage (Vcn). When it is determined that the first comparison voltage (Vcp) is larger than the second comparison voltage (Vcn), the bit of the first comparison signal (BP<2>) comes to be at a logic value "1"; and when it is determined that the first comparison voltage (Vcp) is smaller than the second comparison voltage (Vcn), the bit of the second comparison signal (BN<2>) comes to be at a logic value "1". Next, upon completion of the comparison between the first comparison voltage (Vcp) and the second comparison voltage (Vcn) performed by the comparator $31_3$ (at this time, a voltage difference between the bit of the first comparison signal (BP<2>) and the bit of the second comparison signal (BN<2>) reaches a predetermined threshold value), the bit of the timing signal ($\Phi$<1>) comes to be at the logic value "1", and the comparator $31_2$ enters the enabled mode and starts the comparison between the first comparison voltage (Vcp) and the second comparison voltage (Vcn). When it is determined that the first comparison voltage (Vcp) is larger than the second comparison voltage (Von), the bit of the first comparison signal (BP<1>) comes to be at a logic value "1"; and when it is determined that the first comparison voltage (Vcp) is smaller than the second comparison voltage (Vcn), the bit of the second comparison signal (BN<1>) comes to be at a logic value "1". Lastly, upon completion of the comparison between the first comparison voltage (Vcp) and the second comparison voltage (Vcn) performed by the comparator $31_2$ (at this time, a voltage difference between the bit of the first comparison signal (BP<1>) and the bit of the second comparison signal (BN<1>) reaches the predetermined threshold value), the bit of the timing signal ($\Phi$<0>) comes to be at the logic value "1", and the comparator $31_1$ enters the enabled mode and starts the comparison between the first comparison voltage (Vcp) and the second comparison voltage (Vcn). When it is determined that the first comparison voltage (Vcp) is larger than the second comparison voltage (Vcn), the bit of the first comparison signal (BP<0>) comes to be at a logic value "1"; and when it is determined that the first comparison voltage (Vcp) is smaller than the second comparison voltage (Vcn), the bit of the second comparison signal (BN<0>) comes to be at a logic value "1". It should be noted that asynchronous timing control scheme is adopted in this embodiment.

It should be noted that, in other embodiments, the comparison circuit 3 may include only one comparator instead of three comparators $31_1$-$31_3$. The comparator performs comparison between the first comparison voltage (Vcp) and the second comparison voltage (Vcn) three times, so as to sequentially generate the bits of each of the first comparison signal and the second comparison signal (BP<2:0>/BN<2:0>).

The register 4 is connected to the comparators $31_1$-$31_3$ to receive the comparison output, and is configured to generate the digital output signal (B<2:0>) based on the comparison output. In this embodiment, the register 4 is implemented using D flip-flops, further receives the clock signal ($\Phi$s), and reads in the comparison output as the digital output signal (B<2:0>) upon each rising edge of the clock signal ($\Phi$s).

The controller 5 is connected to the comparison circuit 3 to receive the comparison output, is further connected to the second terminals of the first capacitors $211_1$-$211_3$ and the second terminals of the second capacitors $221_1$-$221_3$, and is configured to, with respect to each of the first capacitors $211_1$-$211_3$ and the second capacitors $221_1$-$221_3$, selectively provide one of the reference voltage (Vref) and a ground voltage to the second terminal of the capacitor $211_1$/$211_2$/$211_3$/$221_1$/$221_2$/$221_3$ based on the comparison output.

In this embodiment, the controller 5 includes a first switch group 51, a second switch group 52, an XOR gate 53 and a control logic 54. The first switch group 51 includes a number (N) of first switches (i.e., three first switches $511_1$-$511_3$ in this embodiment). The first switch ($511_n$) has a first terminal that is connected to the second terminal of the first capacitor ($211_n$), a second terminal that receives the reference voltage (Vref), and a third terminal that receives the ground voltage, where 1≤n≤N (i.e., 1≤n≤3 in this embodiment). The second switch group 52 includes a number (N) of second switches (i.e., three second switches $521_1$-$521_3$ in this embodiment). The second switches ($521_n$) has a first terminal that is connected to the second terminal of the second capacitor ($221_n$), a second terminal that receives the reference voltage (Vref), and a third terminal that receives the ground voltage, where 1≤n≤N (i.e., 1≤n≤3 in this embodiment). Each of the first switches $511_1$-$511_3$ and the second switches $521_1$-$521_3$ is operable in a first state where an electrical connection is established between the first terminal and the second terminal, and a second state where the electrical connection is established between the first terminal and the third terminal. The XOR gate 53 has a number (N−1) of input terminals (i.e., two input terminals in this embodiment) that are connected to the comparators $31_2$, $31_3$ to respectively receive the two most significant bits of the first comparison signal (BP<2:1>), and an output terminal that provides a control signal (Ctrl). The control signal (Ctrl) is at a logic value "0" when the two most significant bits of the first comparison signal (BP<2:1>) have identical logic values, and is at a logic value "1" when otherwise. The control logic 54 is connected to the output terminal of the XOR gate 53 to receive the control signal (Ctrl), is further connected to the comparators $31_2$, $31_3$ to receive the two most significant bits of the first comparison signal (BP<2:1>) and the two most significant bits of the second comparison signal (BN<2:1>), and is further connected to the first switches $511_1$-$511_3$ and the second switches $521_1$-$521_3$. The control logic 54 is configured to generate a first conversion control signal that is N-bits wide (i.e., a first conversion control signal (Cp<2:0>) that is 3-bits wide in this embodiment) and a second conversion control signal that is N-bits wide (i.e., a second conversion control signal (Cn<2:0>) that is 3-bits wide in this embodiment) based on the control signal (Ctrl), the two most significant bits of the first comparison signal (BP<2:1>) and the two most significant bits of the second comparison signal (BN<2:1>), so as to control transition of the first switches $511_1$-$511_3$ and the second switches $521_1$-$521_3$ between the first state and the second state. The first switch ($511_n$) receives a bit of the first conversion control signal (Cp<n-1>), operates in the first state when the bit of the first conversion control signal (Cp<n-1>) is at a logic value "1", and operates in the second state when the bit of the first conversion control signal (Cp<n-1>) is at a logic value "0", and the second switch ($521_n$) receives a bit of the second conversion control signal (Cn<n-1>), operates in the first state when the bit of the second conversion control signal (Cn<n-1>) is at a logic value "1", and operates in the second state when the bit of the second conversion control signal (Cn<n-1>) is at a logic value "0", where 1≤n≤N (i.e., 1≤n≤3 in this embodiment).

Initially, the first conversion control signal (Cp<2:0>) is at the logic value "000", the second conversion control signal (Cn<2:0>) is at the logic value "000", and the ground voltage is provided to the second terminals of the first capacitors $211_1$-$211_3$ and the second terminals of the second capacitors $221_1$-$221_3$. Next, upon completion of the comparison between the first comparison voltage (Vcp) and the second comparison voltage (Vcn) performed by the comparator $31_3$, one of the following occurs: (a) if the bit of the first comparison signal (BP<2>) is at the logic value "0" while the bit of the second comparison signal (BN<2>) is at the logic value "1", the bit of the first conversion control signal (Cp<2>) comes to be at the logic value "1", so the reference voltage (Vref) is provided to the second terminal of the first capacitor $211_3$, and the first comparison voltage (Cp) is increased by (8/12)×Vref; and (b) if the bit of the first comparison signal (BP<2>) is at the logic value "1" while the bit of the second comparison signal (BN<2>) is at the logic value "0", the bit of the second conversion control signal (Cn<2>) comes to be at the logic value "1", so the reference voltage (Vref) is provided to the second terminal of the second capacitor $221_3$, and the second comparison voltage (Cn) is increased by (8/12)×Vref. Lastly, upon completion of the comparison between the first comparison voltage (Vcp) and the second comparison voltage (Vcn) performed by the comparator $31_2$, when the control signal (Ctrl) is at the logic value "1", one of the following occurs: (a) if the bit of the first comparison signal (BP<1>) is at the logic value "0" while the bit of the second comparison signal (BN<1>) is at the logic value "1", the bits of the first conversion control signal (Cp<1:0>) comes to be at the logic value "11", so the reference voltage (Vref) is provided to the second terminals of the first capacitor $211_1$, $211_2$, and the first comparison voltage (Cp) is increased by (4/12)×Vref; and (b) if the bit of the first comparison signal (BP<1>) is at the logic value "1" while the bit of the second comparison signal (BN<1>) is at the logic value "0", the bits of the second conversion control signal (Cn<1:0>) comes to be at the logic value "11", so the reference voltage (Vref) is provided to the second terminals of the second capacitors $221_1$, $221_2$, and the second comparison voltage (Cn) is increased by (4/12)×Vref; and when the control signal (Ctrl) is at the logic value "0", one of the following occurs: (a) if the bit of the first comparison signal (BP<1>) is at the logic value "0" while the bit of the second comparison signal (BN<1>) is at the logic value "1", the bit of the first conversion control signal (Cp<1>) comes to be at the logic value "1", and the bit of the second conversion control signal (Cn<0>) comes to be at the logic value "1", so the reference voltage (Vref) is provided to the second terminal of the first capacitor $211_2$ and the second terminal of the second capacitor $221_1$, the first comparison voltage (Cp) is increased by (3/12)×Vref, and the second comparison voltage (Cn) is increased by (1/12)×Vref; and (b) if the bit of the first comparison signal (BP<1>) is at the logic value "1" while the bit of the second comparison signal (BN<1>) is at the logic value "0", the bit of the first conversion control signal (Cp<0>) comes to be at the logic value "1", and the bit of the second conversion control signal (Cn<1>) comes to be at the logic value "1", so the reference voltage (Vref) is provided to the second terminal of the first capacitor $211_1$ and the second terminal of the second capacitor $221_2$, the first comparison voltage (Cp) is increased by (1/12)×Vref, and the second comparison voltage (Cn) is increased by (3/12)×Vref.

Figure 3:
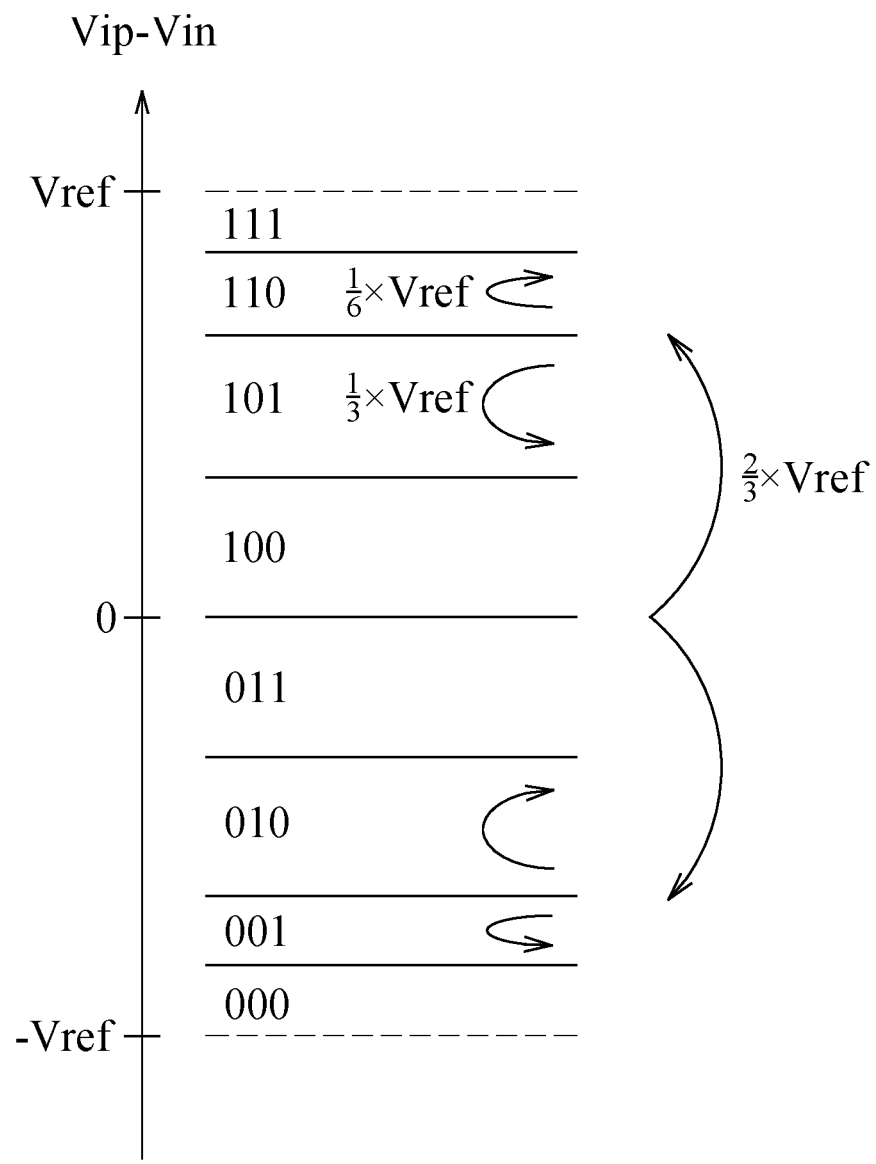
FIG. 3 is a schematic diagram illustrating a relationship between an analog input signal and a digital output signal of the embodiment and a binary search of the embodiment.

As a result, a relationship between the analog input signal (having a voltage equal to the input voltage difference (Vip−Vin)) and the digital output signal (B<2:0>) and a binary search of the successive approximation analog-to-digital converter of this embodiment are as shown in FIG. 3.

It should be noted that, when the digital output signal (B<2:0>) is at any one of logic values "000", "001", "110" and "111", the bit of the digital output signal (B<0>) can serve as an error bit, and can be used in adaptive calibration of the receiver to enhance performance of the receiver.

The successive approximation analog-to-digital converter of this embodiment is operable in a sampling phase, a first conversion phase, a second conversion and a third conversion. In an example where the input voltage difference (Vip−Vin) is equal to (9/12)×Vref, the following Table 1 details the sampling phase, the first conversion phase, the second conversion and the third conversion.

TABLE 1

| Phase | | | |
|---|---|---|---|
| Sampling phase | Cp<2:0> = 000 | Vcp = Vip | BP<2:0> = 000 |
| Φs = 1 | Cn<2:0> = 000 | Vcn = Vin | BN<2:0> = 000 |
| Φ<2:0> = 000 | | Vcp − Vcn = (9/12) × Vref | |
| First | Cp<2:0> = 000 | Vcp = Vip | BP<2:0> = 100 |
| conversion phase | Cn<2:0> = 000 | Vcn = Vin | BN<2:0> = 000 |
| Φs = 0 | | Vcp − Vcn = (9/12) × Vref | |
| Φ<2:0> = 100 | | | |
| Second | Cp<2:0> = 000 | Vcp = Vip | BP<2:0> = 110 |
| conversion phase | Cn<2:0> = 100 | Vcn = Vin + (8/12) × Vref | BN<2:0> = 000 |
| Φs = 0 | | Vcp − Vcn = (1/12) × Vref | |
| Φ<2:0> = 110 | | | |

TABLE 1-continued

| Phase | | | |
|---|---|---|---|
| Third conversion phase<br>Φs = 0<br>Φ<2:0> = 111 | Ctrl = 0<br>Cp<2:0> = 001<br>Cn<2:0> = 110 | Vcp = Vip + (1/12) × Vref<br>Vcn = Vin + (8/12) × Vref + (3/12) × Vref<br>Vcp − Vcn = (−1/12) × Vref | BP<2:0> = 110<br>BN<2:0> = 001 |

In the sampling phase, the clock signal (Φs) is at the logic value "1", the timing signal (Φ<2:0>) is at the logic value "000", the first conversion control signal (Cp<2:0>) is at the logic value "000", the second conversion control signal (Cn<2:0>) is at the logic value "000", the first comparison signal (BP<2:0>) is at the logic value "000", and the second comparison signal (BN<2:0>) is at the logic value "000". Therefore, the first comparison voltage (Vcp) is equal to the first input voltage (Vip), the second comparison voltage (Vcn) is equal to the second input voltage (Vin), and a difference between the first comparison voltage (Vcp) and the second comparison voltage (Vcn) (e.g., Vcp−Vcn, and referred to as comparison voltage difference hereinafter) is equal to (9/12)×Vref.

In the first conversion phase, the clock signal (Φs) comes to be at the logic value "0", the bit of the timing signal (Φ<2>) comes to be at the logic value "1", the bits of the timing signal (Φ<1:0>) are unchanged, the first conversion control signal (Cp<2:0>) is unchanged, and the second conversion control signal (Cn<2:0>) is unchanged. Therefore, the first comparison voltage (Vcp) is unchanged, the second comparison voltage (Vcn) is unchanged, the comparison voltage difference (Vcp−Vcn) is unchanged, the bit of the first comparison signal (BP<2>) comes to be at the logic value "1" since the comparison voltage difference (Vcp−Vcn) is larger than zero, the bits of the first comparison signal (BP<1:0>) are unchanged, and the second comparison signal (BN<2:0>) is unchanged.

In the second conversion phase, the clock signal (Φs) is unchanged, the bit of the timing signal (Φ<1>) comes to be at the logic value "1", and the bits of the timing signal (Φ<2>, Φ<0>) are unchanged. Therefore, the first conversion control signal (Cp<2:0>) is unchanged, the bit of the second conversion control signal (Cn<2>) comes to be at the logic value "1" since the bit of the first comparison signal (BP<2>) is at the logic value "1" while the bit of the second comparison signal (BN<2>) is at the logic value "0", the bits of the second conversion control signal (Cn<1:0>) are unchanged, the first comparison voltage (Vcp) is unchanged, the second comparison voltage (Vcn) is increased by (8/12)× Vref, the comparison voltage difference (Vcp−Vcn) comes to be equal to (1/12)×Vref, the bit of the first comparison signal (BP<1>) comes to be at the logic value "1" since the comparison voltage difference (Vcp−Vcn) is larger than zero, the bits of the first comparison signal (BP<2>, BP<0>) are unchanged, and the second comparison signal (BN<2:0>) is unchanged.

In the third conversion phase, the clock signal (Φs) is unchanged, the bit of the timing signal (Φ<0>) comes to be at the logic value "1", and the bits of the timing signal (Φ<2:1>) are unchanged. Therefore, the control signal (Ctrl) is at the logic value "0" since both of the bits of the first comparison signal (BP<2:1>) is at the same logic value, the bit of the first conversion control signal (Cp<0>) comes to be at the logic value "1" and the bit of the second conversion control signal (Cn<1>) comes to be at the logic value "1" since the control signal (Ctrl) is at the logic value "0" and since the bit of the first comparison signal (BP<1>) is at the logic value "1" while the bit of the second comparison signal (BN<1>) is at the logic value "0", the bits of the first conversion control signal (Cp<2:1>) are unchanged, the bits of the second conversion control signal (Cn<2>, Cn<0>) are unchanged, the first comparison voltage (Vcp) is increased by (1/12)×Vref, the second comparison voltage (Vcn) is increased by (3/12)×Vref, the comparison voltage difference (Vcp−Vcn) comes to be equal to (−1/12)×Vref, the first comparison signal (BP<2:0>) is unchanged, the bit of the second comparison signal (BN<0>) comes to be at the logic value "1" since the comparison voltage difference (Vcp−Vcn) is smaller than zero, and the bits of the second comparison signal (BN<2>, BN<0>) are unchanged. At an end of this phase, the digital output signal (B<2:0>) being at the logic value "110" is obtained.

In another example where the input voltage difference (Vip−Vin) is equal to (−6/12)×Vref, the following Table 2 details the sampling phase, the first conversion phase, the second conversion phase and the third conversion phase.

TABLE 2

| Phase | | | |
|---|---|---|---|
| Sampling phase<br>Φs = 1<br>Φ<2:0> = 000 | Cp<2:0> = 000<br>Cn<2:0> = 000 | Vcp = Vip<br>Vcn = Vin<br>Vcp − Vcn = (−6/12) × Vref | BP<2:0> = 000<br>BN<2:0> = 000 |
| First conversion phase<br>Φs = 0<br>Φ<2:0> = 100 | Cp<2:0> = 000<br>Cn<2:0> = 000 | Vcp = Vip<br>Vcn = Vin<br>Vcp − Vcn = (−6/12) × Vref | BP<2:0> = 000<br>BN<2:0> = 100 |
| Second conversion phase<br>Φs = 0<br>Φ<2:0> = 110 | Cp<2:0> = 100<br>Cn<2:0> = 000 | Vcp = Vip + (8/12) × Vref<br>Vcn = Vin<br>Vcp − Vcn = (2/12) × Vref | BP<2:0> = 010<br>BN<2:0> = 100 |
| Third conversion phase<br>Φs = 0<br>Φ<2:0> = 111 | Ctrl = 1<br>Cp<2:0> = 100<br>Cn<2:0> = 011 | Vcp = Vip + (8/12) × Vref<br>Vcn = Vin + (4/12) × Vref<br>Vcp − Vcn = (−2/12) × Vref | BP<2:0> = 010<br>BN<2:0> = 101 |

In the sampling phase, the clock signal (Φs) is at the logic value "1", the timing signal (Φ<2:0>) is at the logic value "000", the first conversion control signal (Cp<2:0>) is at the logic value "000", the second conversion control signal (Cn<2:0>) is at the logic value "000", the first comparison signal (BP<2:0>) is at the logic value "000", and the second comparison signal (BN<2:0>) is at the logic value "000". Therefore, the first comparison voltage (Vcp) is equal to the first input voltage (Vip), the second comparison voltage (Vcn) is equal to the second input voltage (Vin), and the comparison voltage difference (Vcp−Vcn) is equal to (−6/12)×Vref.

In the first conversion phase, the clock signal (Φs) comes to be at the logic value "0", the bit of the timing signal (Φ<2>) comes to be at the logic value "1", the bits of the timing signal (Φ<1:0>) are unchanged, the first conversion control signal (Cp<2:0>) is unchanged, and the second conversion control signal (Cn<2:0>) is unchanged. Therefore, the first comparison voltage (Vcp) is unchanged, the second comparison voltage (Vcn) is unchanged, the comparison voltage difference (Vcp−Vcn) is unchanged, the first comparison signal (BP<2:0>) are unchanged, the bit of the second comparison signal (BN<2>) comes to be at the logic value "1" since the comparison voltage difference (Vcp−Vcn) is smaller than zero, and the bits of the second comparison signal (BN<1:0>) are unchanged.

In the second conversion phase, the clock signal (Φs) is unchanged, the bit of the timing signal (Φ<1>) comes to be at the logic value "1", and the bits of the timing signal (Φ<2>, Φ<0>) are unchanged. Therefore, the bit of the first conversion control signal (Cp<2>) comes to be at the logic value "1" since the bit of the first comparison signal (BP<2>) is at the logic value "0" while the bit of the second comparison signal (BN<2>) is at the logic value "1", the bits of the first conversion control signal (Cp<1:0>) are unchanged, the second conversion control signal (Cn<2:0>) is unchanged, the first comparison voltage (Vcp) is increased by (8/12)×Vref, the second comparison voltage (Vcn) is unchanged, the comparison voltage difference (Vcp−Vcn) comes to be equal to (2/12)×Vref, the bit of the first comparison signal (BP<1>) comes to be at the logic value "1" since the comparison voltage difference (Vcp−Vcn) is larger than zero, the bits of the first comparison signal (BP<2>, BP<0>) are unchanged, and the second comparison signal (BN<2:0>) is unchanged.

In the third conversion phase, the clock signal (Φs) is unchanged, the bit of the timing signal (Φ<0>) comes to be at the logic value "1", and the bits of the timing signal (Φ<2:1>) are unchanged. Therefore, the control signal (Ctrl) is at the logic value "1" since the bits of the first comparison signal (BP<2:1>) are at different logic values, the first conversion control signal (Cp<2:0>) is unchanged, the bits of the second conversion control signal (Cn<1:0>) come to be at the logic value "11" since the control signal (Ctrl) is at the logic value "1" and since the bit of the first comparison signal (BP<1>) is at the logic value "1" while the bit of the second comparison signal (BN<1>) is at the logic value "0", the bit of the second conversion control signal (Cn<2>) is unchanged, the first comparison voltage (Vcp) is unchanged, the second comparison voltage (Vcn) is increased by (4/12)×Vref, the comparison voltage difference (Vcp−Vcn) comes to be equal to (−2/12)×Vref, the first comparison signal (BP<2:0>) is unchanged, the bit of the second comparison signal (BN<0>) comes to be at the logic value "1" since the comparison voltage difference (Vcp−Von) is smaller than zero, and the bits of the second comparison signal (BN<2>, BN<0>) are unchanged. At an end of this phase, the digital output signal (B<2:0>) being at the logic value "010" is obtained.

In view of the above, the successive approximation analog-to-digital converter of this embodiment requires three comparators $31_1$-$31_3$ and a reference voltage (Vref) when being used in a PAM-6 receiver, and advantageously occupies a small area and has low power consumption.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A successive approximation analog-to-digital converter adapted to convert an analog input signal that is in a pulse amplitude modulation (PAM)-($2^N$−2) format into a digital output signal that is N-bits wide, where N≥3, said successive approximation analog-to-digital converter comprising:

a switch circuit adapted to receive a first input voltage and a second input voltage that cooperatively represent the analog input signal, operable in an ON state and an OFF state, and configured to permit transmission of the first input voltage and the second input voltage therethrough when operating in the ON state, and to prevent the transmission of the first input voltage and the second input voltage therethrough when operating in the OFF state;

a conversion circuit including a first capacitor group including a first common node, and a number (N) of first capacitors each having a first terminal and a second terminal, said first common node being connected to said first terminals of said first capacitors, and being further connected to said switch circuit to receive the first input voltage, said first capacitors cooperatively outputting, at said first common node, a first comparison voltage that is equal to the first input voltage when said switch circuit operates in the ON state, and that varies according to voltages at said second terminals of said first capacitors when said switch circuit operates in the OFF state, and a second capacitor group including a second common node, and a number (N) of second capacitors each having a first terminal and a second terminal, said second common node being connected to said first terminals of said second capacitors, and being further connected to said switch circuit to receive the second input voltage, said second capacitors cooperatively outputting, at said second common node, a second comparison voltage that is equal to the second input voltage when said switch circuit operates in the ON state, and that varies according to voltages at said second terminals of said second capacitors when said switch circuit operates in the OFF state;

a comparison circuit connected to said first common node and said second common node to receive the first comparison voltage and the second comparison voltage, and configured to compare the first comparison voltage and the second comparison voltage so as to generate a comparison output including a first comparison signal that is N-bits wide and a second comparison signal that is N-bits wide, where generation of a least significant bit of the first comparison signal and a least significant bit of the second comparison signal is related to two of said first capacitors and two of said second capacitors;

a register connected to said comparison circuit to receive the comparison output, and configured to generate the digital output signal based on the comparison output; and a controller connected to said comparison circuit to receive the comparison output, further connected to said second terminals of said first capacitors and said second terminals of said second capacitors, and configured to, with respect to each of said first capacitors and said second capacitors, selectively provide one of a reference voltage and a ground voltage to said second terminal of said capacitor based on the comparison output;

wherein, when a number (N−1) of most significant bits of the first comparison signal have identical logic values, said controller provides the reference voltage and the ground voltage respectively to said two first capacitors that are related to the generation of the least significant bit of the first comparison signal and the least significant bit of the second comparison signal, and provides the reference voltage and the ground voltage respectively to said two second capacitors that are related to the generation of the least significant bit of the first comparison signal and the least significant bit of the second comparison signal; and when otherwise, said controller provides one of the reference voltage and the ground voltage to both of said two first capacitors that are related to the generation of the least significant bit of the first comparison signal and the least significant bit of the second comparison signal, and provides the other one of the reference voltage and the ground voltage to both of said two second capacitors that are related to the generation of the least significant bit of the first comparison signal and the least significant bit of the second comparison signal.

2. The successive approximation analog-to-digital converter as claimed in claim 1, wherein said controller includes:

a first switch group including a number (N) of first switches, each of said first switches having a first terminal that is connected to said second terminal of a respective one of said first capacitors, a second terminal that receives the reference voltage, and a third terminal that receives the ground voltage;

a second switch group including a number (N) of second switches, each of said second switches having a first terminal that is connected to said second terminal of a respective one of said second capacitors, a second terminal that receives the reference voltage, and a third terminal that receives the ground voltage;

each of said first switches and said second switches being operable in a first state where an electrical connection is established between said first terminal and said second terminal, and a second state where the electrical connection is established between said first terminal and said third terminal;

an XOR gate having a number (N−1) of input terminals that are connected to said comparison circuit to respectively receive the number (N−1) of most significant bits of the first comparison signal, and an output terminal that provides a control signal; and a control logic connected to said output terminal of said XOR gate to receive the control signal, further connected to said comparison circuit to receive the number (N−1) of most significant bits of the first comparison signal and a number (N−1) of most significant bits of the second comparison signal, and further connected to said first switches and said second switches, said control logic being configured to control transition of said first switches and said second switches between the first state and the second state based on the control signal, the number (N−1) of most significant bits of the first comparison signal and the number (N−1) of most significant bits of the second comparison signal.

3. The successive approximation analog-to-digital converter as claimed in claim 1, wherein said comparison circuit includes:

a number (N) of comparators, each of which is connected to said first common node and said second common node to receive the first comparison voltage and the second comparison voltage, and is operable in an enabled mode where comparison between the first comparison voltage and the second comparison voltage is performed so as to generate a respective bit of the first comparison signal and a respective bit of the second comparison signal and a disabled mode where the comparison is not performed; and a timing generator connected to said comparators, receiving the number (N−1) of most significant bits of the first comparison signal and a number (N−1) of most significant bits of the second comparison signal from some of said comparators, further receiving a clock signal, and configured to control transition of said comparators between the enabled mode and the disabled mode based on the number (N−1) of most significant bits of the first comparison signal, the number (N−1) of most significant bits of the second comparison signal and the clock signal.

4. The successive approximation analog-to-digital converter as claimed in claim 1, wherein:

said switch circuit includes a first sampling switch and a second sampling switch;

said first sampling switch has a first terminal that is adapted to receive the first input voltage, and a second terminal that is connected to said first common node;

said second sampling switch has a first terminal that is adapted to receive the second input voltage, and a second terminal that is connected to said second common node;

each of said first sampling switch and said second sampling switch further receives a clock signal, and transitions between conduction and non-conduction based on the clock signal; and said switch circuit operates in the ON state when both of said first sampling switch and said second sampling switch conduct, and operates in the OFF state when none of said first sampling switch and said second sampling switch conducts.

5. The successive approximation analog-to-digital converter as claimed in claim 1, wherein:

a ratio of capacitances of said two first capacitors that are related to the generation of the least significant bit of the first comparison signal and the least significant bit of the second comparison signal is 3:1; and a ratio of capacitances of said two second capacitors that are related to the generation of the least significant bit of the first comparison signal and the least significant bit of the second comparison signal is 3:1.

* * * * *